United States Patent
Nguyen et al.

(10) Patent No.: US 7,505,503 B2
(45) Date of Patent: Mar. 17, 2009

(54) VERTICAL CAVITY SURFACE EMITTING LASER (VCSEL) AND RELATED METHOD

(75) Inventors: Nguyen X. Nguyen, Granada Hills, CA (US); Charles F. Krumm, Newport Coast, CA (US)

(73) Assignee: Cosemi Technologies, Inc., Irvine, CA (US)

( * ) Notice: Subject to any disclaimer, the term of this patent is extended or adjusted under 35 U.S.C. 154(b) by 0 days.

(21) Appl. No.: 11/678,194

(22) Filed: Feb. 23, 2007

(65) Prior Publication Data

US 2008/0205465 A1 Aug. 28, 2008

(51) Int. Cl.
*H01S 5/183* (2006.01)
(52) U.S. Cl. .............................. 372/50.124; 372/46.01; 372/46.015; 372/45.01; 438/46
(58) Field of Classification Search ............ 372/46.015, 372/50.124, 46.01; 438/38, 46
See application file for complete search history.

(56) References Cited

U.S. PATENT DOCUMENTS

| | | | |
|---|---|---|---|
| 4,949,350 A | 8/1990 | Jewell | |
| 5,245,622 A | 9/1993 | Jewell | |
| 5,359,612 A | 10/1994 | Dennis | |
| 5,359,618 A | 10/1994 | Lebby | |
| 5,446,752 A | 8/1995 | Ackley | |
| 5,500,868 A * | 3/1996 | Kurihara | 372/46.015 |
| 5,530,715 A | 6/1996 | Shieh | |
| 5,557,626 A | 9/1996 | Grodzinski | |
| 6,751,245 B1 * | 6/2004 | Wasserbauer et al. | 372/46.01 |
| 6,757,313 B1 * | 6/2004 | Connolly et al. | 372/46.015 |
| 7,095,768 B2 | 8/2006 | Jiang | |
| 2003/0231682 A1 * | 12/2003 | Eitel | 372/45 |
| 2004/0086013 A1 * | 5/2004 | Kim | 372/45 |
| 2004/0120376 A1 * | 6/2004 | Kwak | 372/45 |

OTHER PUBLICATIONS

Weng W. Chow, Design, Fabrication, and Performance of Infrared and Visible Vertical-Cavity Surface-Emitting Lasers, IEEE Journal of Quantum Electronics, vol. 33, No. 10, Oct. 1997.
Unknown Author, Ion Implantation, City University of Hong Kong.
M. Urteaga, Wide Bandwidth InP DHBT Technology Utilizing Dielectric Sidewall Spacers, IPRM Digest 2004.

* cited by examiner

*Primary Examiner*—Minsun Harvey
*Assistant Examiner*—Michael Carter
(74) *Attorney, Agent, or Firm*—Fountain Law Group, Inc.; George L. Fountain

(57) ABSTRACT

A vertical cavity surface emitting laser (VCSEL) is disclosed that has a relatively low vertical resistance between the Ohmic contact to the upper distributed Bragg reflector (DBR) and the active layer, and a structure to substantially confine the current flow to the laser cavity so that the VCSEL can produce a more efficient and substantially single-mode output. In particular, the VCSEL includes a substrate, a lower DBR disposed over the substrate, an active layer disposed over the lower DBR, and an upper DBR. The upper DBR includes a groove and an Ohmic contact situated within the groove to lower the vertical resistance between the contact and the active layer. An ion implanted layer is also formed along the side wall of the active layer to substantially confine the current flow to the laser cavity.

35 Claims, 5 Drawing Sheets

VERTICAL CAVITY SURFACE EMITTING LASER (VCSEL) AND RELATED METHOD

FIELD OF THE INVENTION

This invention relates generally to vertical cavity surface emitting lasers (VCSEL), and in particular, to a VCSEL including a current confinement structure formed by steep angle ion implantation for substantial single-mode operation and an Ohmic contact buried into the upper mirror for reduced vertical resistance.

BACKGROUND OF THE INVENTION

A Vertical Cavity Surface Emitting Laser (VCSEL) is a very attractive source for many applications. For instance, VCSELs typically generate a laser beam having a cross-section that is well defined, relatively narrow, and substantially symmetrical with respect to the transmission axis. Additionally, VCSELs are relatively easy to manufacture and standard semiconductor tooling and processes may be used in the manufacturing of the devices. Because of their generally vertical configuration, numerous VCSEL devices may be formed on a single wafer.

Although a single wafer may accommodate a large number of devices, the number of commercial-quality VCSELs that can be produced is typically much smaller because the fabrication yield is typically low. One of the reasons for the relatively low yield is that typically there are a number of uncontrolled factors in the fabrication process that often results in whole wafers being discarded because they fail to meet reliability screening criteria. Another reason is that even if the reliability criteria are met, the performance of individual devices may not meet requirements.

Both of these yield factors stem from various conventional techniques that are used to control the dimensions of the generally columnar-shaped volume of semiconductor material that forms the laser cavity. In the relevant art, distinct process techniques are used to define the dimensions of the column-shaped laser cavity of conventional VCSELs. According to one technique, the active area and top and bottom mirrors, consisting of stack layers of AlGaAs with alternating indices of refraction, are formed to define the laser cavity portion. Then, a thicker layer of relatively high aluminum content AlGaAs at the bottom of the stack is oxidized to form a doughnut-like layer of oxide that defines the laser beam profile. Generally, the controlling of the oxidation of the aluminum to achieve a required beam diameter and produce an oxide layer that does not degrade during the operational life of the VCSEL is difficult and often results in low yields.

SUMMARY OF THE INVENTION

An aspect of the invention relates to a vertical cavity surface emitting laser (VCSEL) that has a relatively low vertical resistance. The VCSEL comprises a substrate; a lower mirror disposed over the substrate; an active layer disposed over the lower mirror; and an upper mirror disposed over the active layer. The upper mirror includes a groove that extends into the upper mirror. An Ohmic contact to the upper mirror is formed within the groove. By partially burying the Ohmic contact into the upper mirror, the vertical resistance between the Ohmic contact and the active layer may be significantly reduced. This improves the beam generation efficiency of the VCSEL. The Ohmic contact may also be configured to define the shape of the optical beam produced by the VCSEL.

The VCSEL may be based on Gallium Arsenide (GaAs) or Aluminum GaAs (AlGaAs) material or other suitable semiconductor materials. The upper and lower mirrors may be configured as a distributed Bragg reflector (DBR). An ion implanted layer may be formed on the sidewall of the active layer and optionally the sidewall of the upper mirror to confine the current flow substantially within the laser cavity, and away from the surface of the active layer. The lower mirror similarly may include a groove and an Ohmic contact to the lower mirror situated within the groove. Bond pads may be disposed over an exposed region of the substrate. The bond pads may be configured to make electrical contact respectively to the upper and lower mirrors via the corresponding Ohmic contacts.

Another aspect of the invention relates to a method of manufacturing the VCSEL. The method comprises forming a lower mirror over a substrate; forming an active layer over the lower mirror; forming an upper mirror over the active layer; etching the upper mirror by, for example, a dry etching process to form the groove; and depositing a metallization layer into the groove to form the Ohmic contact to the upper mirror. As discussed above, the partially buried Ohmic contact reduces the vertical resistance between the Ohmic contact and the active layer. Additionally, the Ohmic contact may be configured to define the shape of the optical beam produced by the VCSEL.

Yet another aspect of the invention relates to a VCSEL that achieves a substantially single mode output. The VCSEL comprises a substrate; a lower mirror disposed over the substrate; an active layer disposed over the lower mirror; and an upper mirror disposed over the active layer. An ion implanted layer is disposed on the sidewall of the active layer and optionally the sidewall of the upper mirror to substantially confine the current flow within the laser cavity, and away from its surface. This improves the optical generating efficiency of the VCSEL by reducing non-radiative electron-hole recombination near the laser cavity surface. The ion implanted layer may be formed by a relatively low energy, steep angle implant. The low energy implant reduces damage to the laser cavity, thus leading to a more uniform laser cavity which results in substantially a single mode output. A single mode output as opposed to a multi-mode output results in a higher output efficiency for the VCSEL, and makes the VCSEL more suitable for some applications that multi-mode VCSELs cannot address.

Still another aspect of the invention relates to a method of manufacturing the VCSEL. The method comprises forming a lower mirror over a substrate; forming an active layer over the lower mirror; forming an upper mirror over the active layer; forming a passivation layer along a side wall of the active layer; and implanting ions at a steep angle into the passivation layer. The direction of the implantation may be skewed from the vertical axis of the VCSEL by a predetermined angle (e.g., approximately 20 degrees or greater). The energy of the ion implantation may be such that the ion concentration is substantially maximum at approximately the interface of the implanted layer and the active layer. This improves the current confinement property of the implanted layer, while reducing damage to the laser cavity caused by the ion implantation.

Other aspects, advantages and novel features of the present invention will become apparent from the following detailed description of the invention when considered in conjunction with the accompanying drawings.

DETAILED DESCRIPTION OF THE EXEMPLARY EMBODIMENTS

Figure 1:
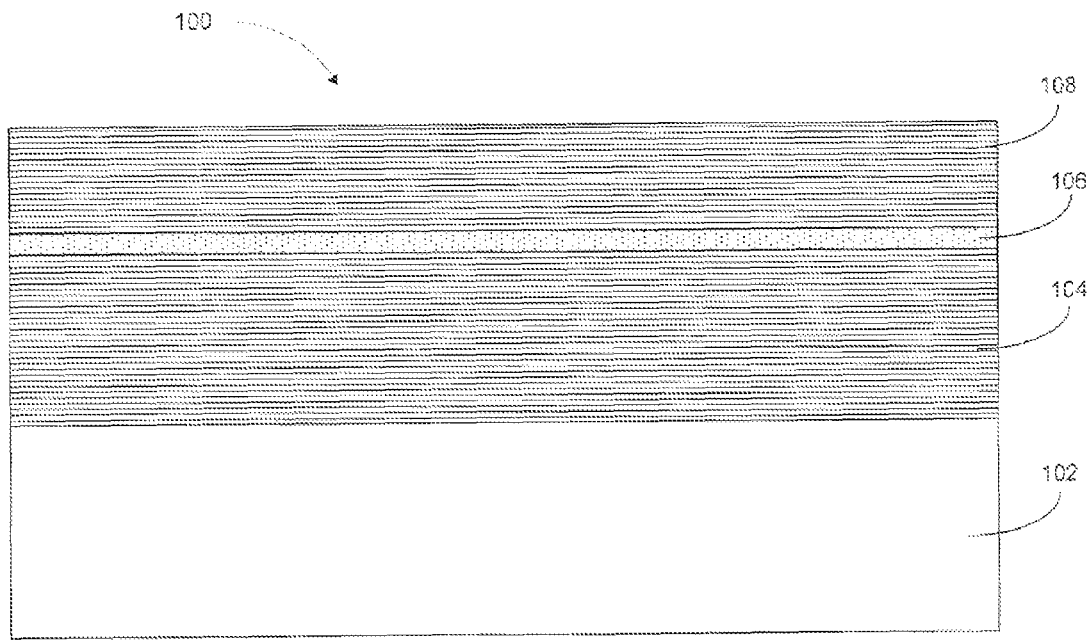
FIGS. 1-3, 4A, and 5-6 illustrate cross-sectional views of an exemplary vertical cavity surface emitting laser (VCSEL) at various stages of an exemplary method of manufacturing the VCSEL in accordance with an embodiment of the invention.

FIG. 1 illustrates a cross-sectional view of an exemplary vertical cavity surface emitting laser (VCSEL) 100 at an intermediate stage of a method of manufacturing the VCSEL in accordance with an embodiment of the invention. At this stage, the VCSEL 100 comprises a substrate 102, a lower mirror 104 disposed over the substrate 102, an active layer 106 disposed over the lower mirror 104, and an upper mirror 108 disposed over the active layer 106. In the exemplary embodiment, a Gallium-Arsenide (GaAs) based VCSEL is used to exemplify the invention. It shall be understood that the VCSEL may be based on other semiconductor materials.

The substrate 102 may be formed of any suitable material, such as GaAs. The lower mirror 104 may be configured as a distributed Bragg reflector (DBR) or other type of reflector. As a DBR, the lower mirror 104 may be comprised of a plurality of stacked layers of GaAs and/or Aluminum GaAs (AlGaAs) materials having alternating indices of refraction, respectively. The lower mirror 104 may be doped with an n-type dopant, and may be referred to hereinafter as the lower DBR 104. The lower DBR 104 may be epitaxially grown on top of the GaAs substrate 102.

The active layer 106 may be comprised of any suitable semiconductor material, such as GaAs or AlGaAs. The active layer 106 generates the electron-hole pair recombination to generate the photon energy for the VCSEL 100. The active layer 106 may be epitaxially grown on top of the lower DBR 104.

The upper mirror 108 may be configured as a distributed Bragg reflector (DBR) or other type of reflector. As a DBR, the upper mirror 108 may be comprised of a plurality of stacked layers of GaAs and/or AlGaAs materials having alternating indices of refraction, respectively. The upper mirror 108 may be doped with a p-type dopant, and may be referred to hereinafter as the upper DBR 108. The upper DBR 108 may be epitaxially grown on top of the active layer 106.

Figure 2:
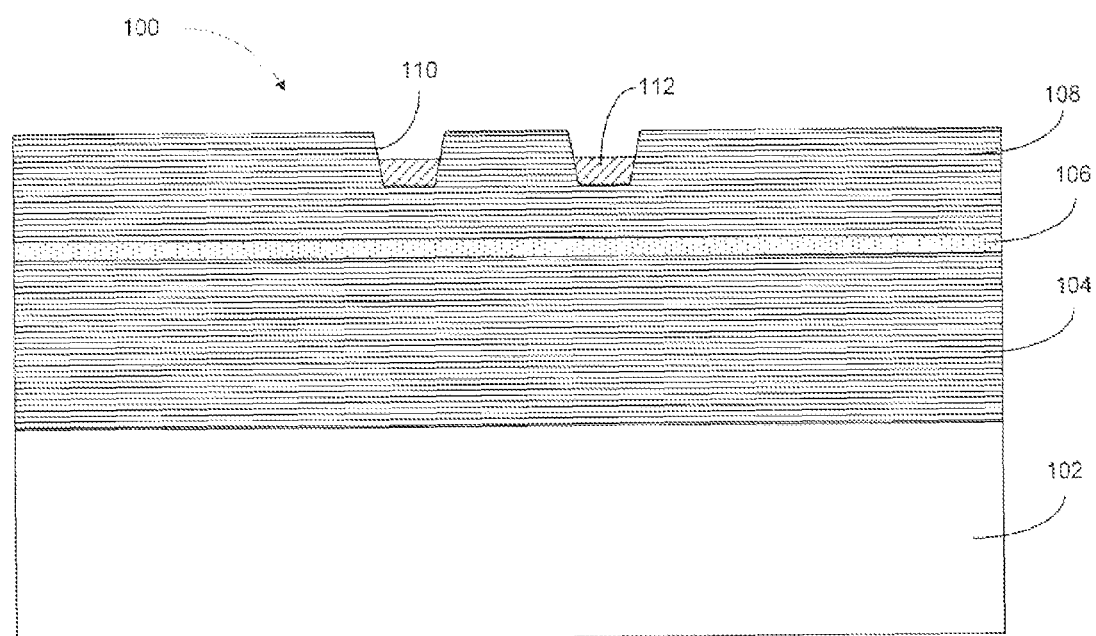

FIG. 2 illustrates a cross-sectional view of the exemplary VCSEL 100 at a subsequent stage of a method of manufacturing the VCSEL in accordance with an embodiment of the invention. According to the method, a groove 110 is formed into the upper DBR 108. The groove 110 may be ring-shaped, partial ring-shaped, elliptical, square, rectangular, etc., and may be formed by an etching process, such as a dry etching process. The groove 110 may extend partially within the upper DBR 108, such as approximately half way into the upper DBR 108.

Then, an Ohmic contact 112 to the upper DBR 108 is formed within the groove 110 by a metal deposition and alloying process. The metallization of the Ohmic contact 112 may be deposited using a liftoff method used in fabricating devices on GaAs and related materials. By partially burying the Ohmic contact 112 into the upper DBR 108, the vertical resistance between the Ohmic contact 112 and active layer 106 is reduced. This improves the beam generating efficiency of the VCSEL 100.

Additionally, the Ohmic contact 112 and groove 110 may be configured to define the shape of the optical beam produced by the VCSEL 100 by serving as a boundary for the perimeter of the beam. For example, if the Ohmic contact 112 and groove 110 are configured into a ring or partial ring, the shape of the beam may be cylindrical; i.e., the region enclosed or partially enclosed by the ring-shaped contact. If, the Ohmic contact 112 and groove are configured into an elliptical ring or partial elliptical ring, the shape of the beam may be elliptical. The region enclosed by the pattern of the Ohmic contact 112 and groove 110 defines the general shape of the optical beam produced by the VCSEL 100.

Figure 3:
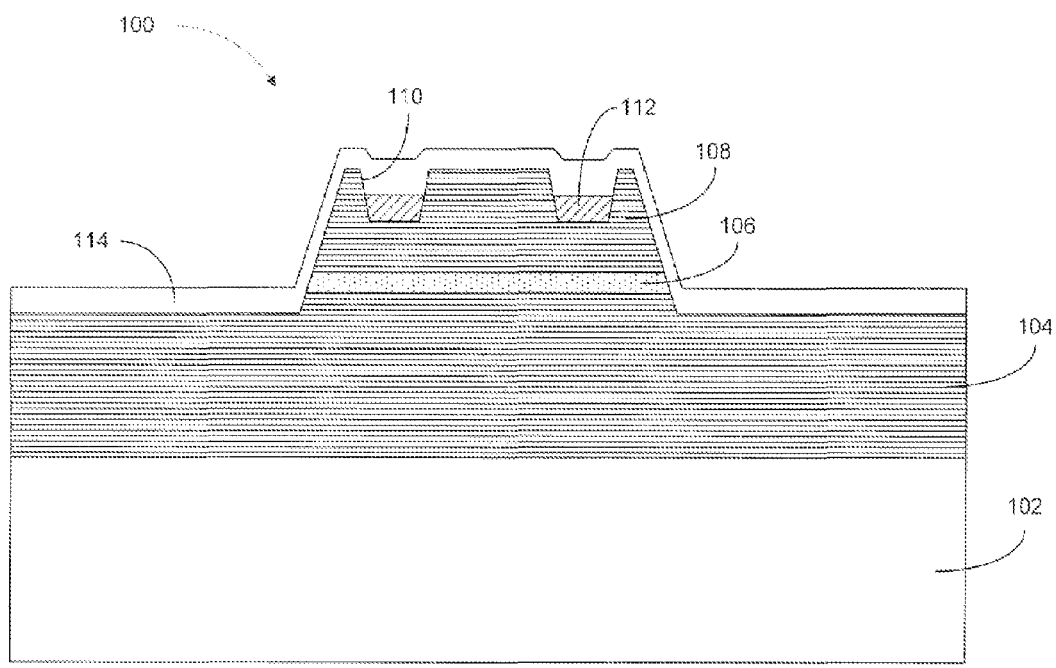

FIG. 3 illustrates a cross-sectional view of the exemplary VCSEL 100 at a subsequent stage of a method of manufacturing the VCSEL in accordance with an embodiment of the invention. After the Ohmic contact 112 is formed, a mesa is formed around and below the Ohmic contact 112 to define the lateral perimeter (e.g., diameter) of the laser cavity of the VCSEL 100. This is accomplished by removing the upper DBR 108, active layer 106, and an upper portion of the lower DBR 104 around and below the Ohmic contact 112. The removal of these materials may be performed by an etching process, such as a dry etching process. A subsequent non-selective wet etching process may be performed to remove surface damage that may have resulted from the dry etching process.

After the lateral perimeter of the laser cavity has been defined, a passivation layer 114 is formed over the lower DBR 104, over the side wall of the active layer 106 and the upper DBR 108, and over the upper DBR 108 including Ohmic contact 112 within the groove 110. The passivation layer 114 protects the underlying layers from exposure to the atmosphere. The passivation layer 114 may be formed of any suitable passivation (dielectric) material, such as silicon nitride ($Si_xN_y$), Silicon Oxide ($SiO_2$), and others. The thickness of the passivation layer 114 is relatively large on the horizontal surfaces and relatively small on the sidewall of the active layer 106 and upper DBR 108.

Figure 4A:
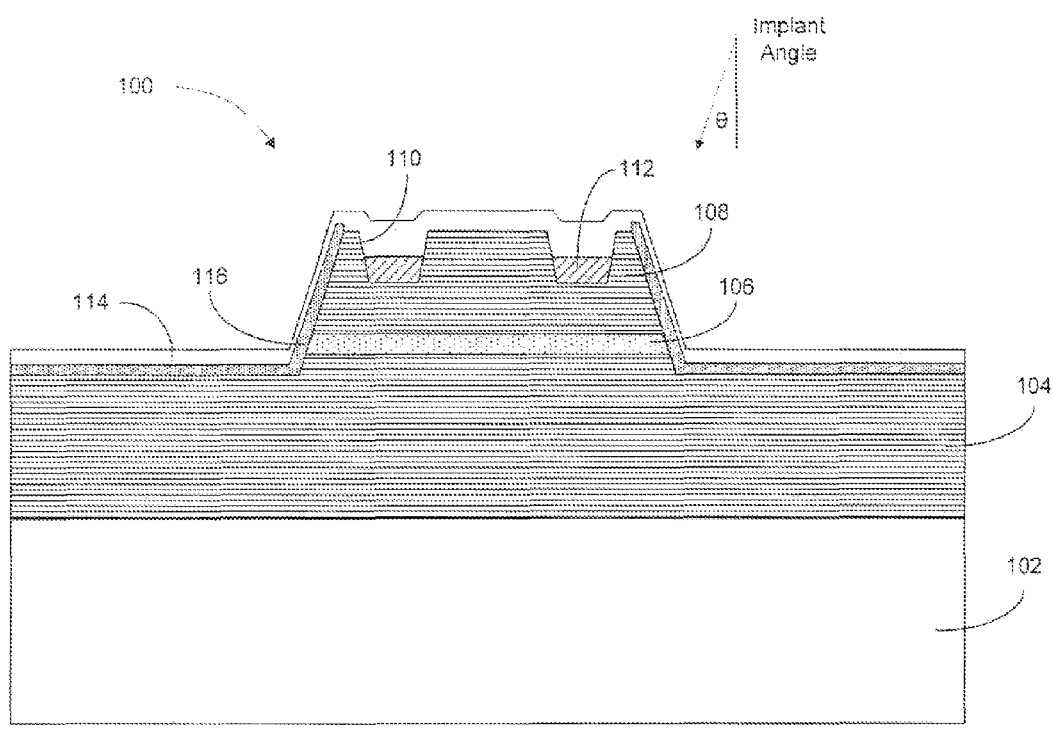

FIG. 4A illustrates a cross-sectional view of the exemplary VCSEL 100 at a subsequent stage of a method of manufacturing the VCSEL in accordance with an embodiment of the invention. After the passivation layer is formed, the VCSEL 100 is subjected to an ion implantation process to form an implanted layer 116 along the side wall of the active layer 106 and optionally the upper mirror 108 to substantially confine the current flow away from the surface of the laser cavity, thereby avoiding excessive non-radiative recombination that can have adverse effects on the optical generation efficiency of the VCSEL 100. In the exemplary embodiment, the direction of the implantation may be skewed from the vertical axis of the VCSEL 100 by an angle θ of approximately 20 degrees or greater (e.g., between ~20 to 45 degrees). This is referred to herein as a steep angle ion implantation process. This process facilitates a better implant concentration profile in the passivation layer 114 and the sidewall of the active layer 106 and upper mirror 108, and reduces the depth of the ion penetration into the lower DBR 104.

Figure 4B:
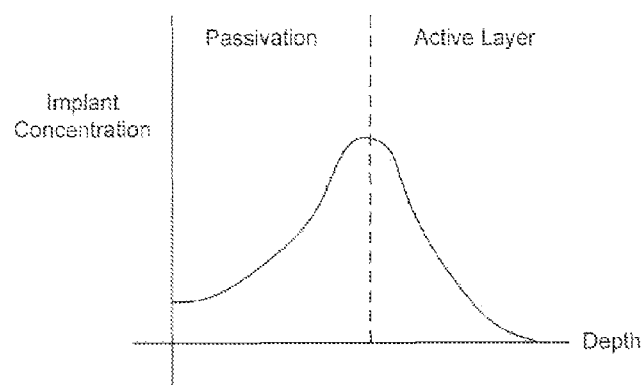
FIG. 4B illustrates a graph depicting an exemplary ion implantation profile of a current confining portion of the exemplary VCSEL in accordance with another embodiment of the invention.

FIG. 4B illustrates a graph depicting an exemplary ion implantation profile of a current confining portion of the exemplary VCSEL 100 in accordance with an embodiment of the invention. As the graph illustrates, the energy of the ion implantation should be such that the implant concentration is maximum around the interface of the passivation layer 114 and the active layer 106. Any higher energy may result in damage to the active layer 106, which may reduce the optical generation efficiency of the VCSEL 100. Similarly, any lower energy may result in too low of an implant concentration at the interface of the passivation layer 114 and the active layer 106 that reduces the current confinement property of the implanted layer 116.

Figure 5:
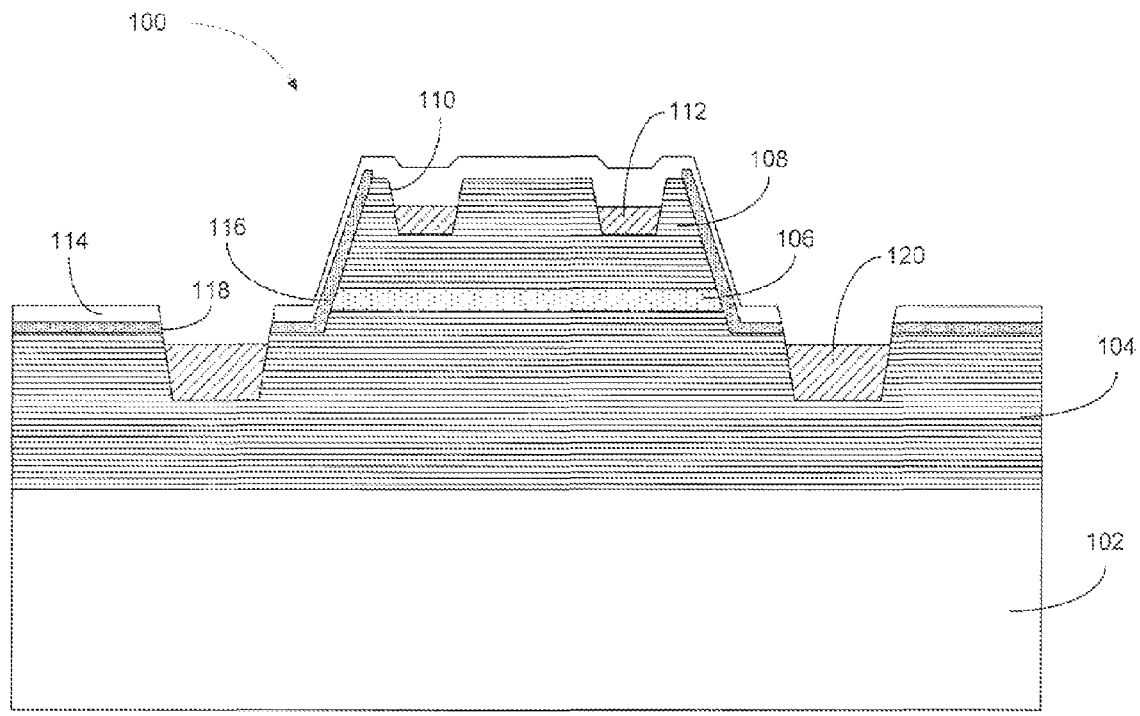

FIG. 5 illustrates a cross-sectional view of the exemplary VCSEL 100 at a subsequent stage of a method of manufacturing the VCSEL in accordance with an embodiment of the invention. After the steep angle ion implantation has been performed, a groove 118 is formed through the passivation layer 114 and the implanted layer 116 and into the lower DBR 104. The groove 118 may be elliptical ring-shaped, partial ring-shaped, elliptical, square, rectangular etc., and may be formed by an etching process, such as a dry etching process. The groove 118 may extend partially within the lower DBR 104. Then, an Ohmic contact 120 to the lower DBR 104 is formed within the groove 118 by a metal deposition and alloying process. The metallization of the Ohmic contact 118 may be deposited using the liftoff method used in fabricating devices on GaAs and related materials.

Figure 6:
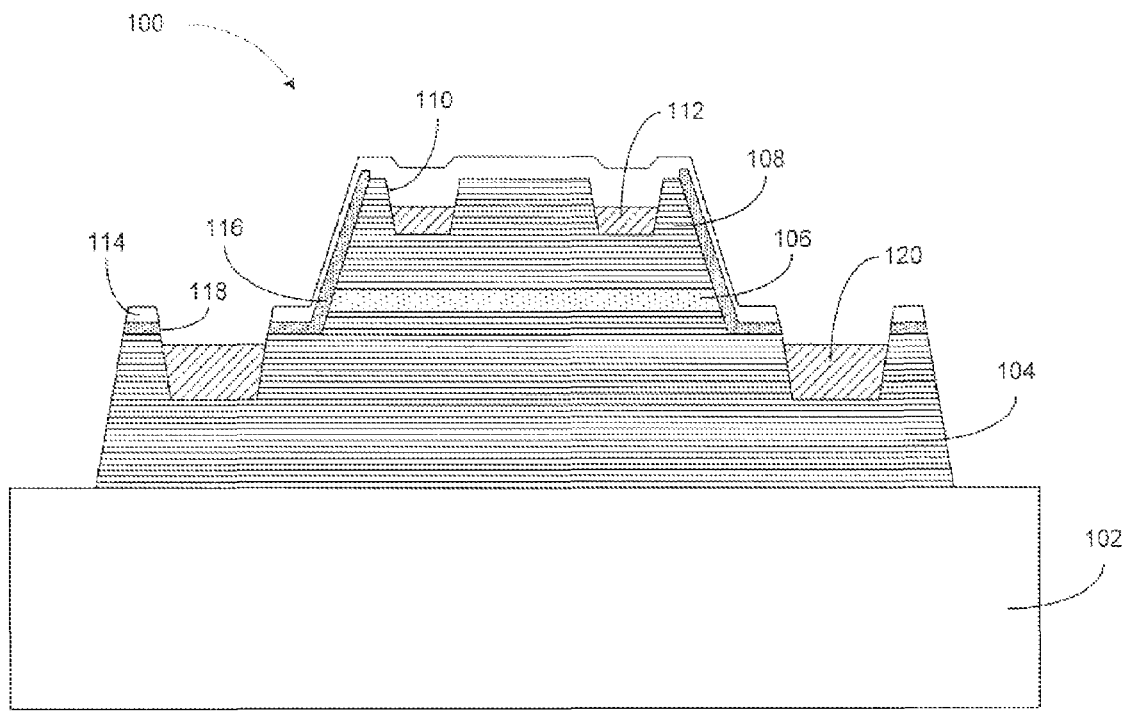

FIG. 6 illustrates a cross-sectional view of the exemplary VCSEL 100 at a subsequent stage of a method of manufacturing the VCSEL in accordance with an embodiment of the invention. After the Ohmic contact 120 to the lower DBR 104 is formed, the outer perimeter region of the lower DBR 104 is removed by, for example, a wet etching process to define and isolate the overall device structure and to expose the underlying substrate 102. Bond pads may then be deposited onto the substrate 102 to achieve a low capacitance configuration, which leads to a high modulation speed characteristic for the VCSEL 100.

Figure 7:
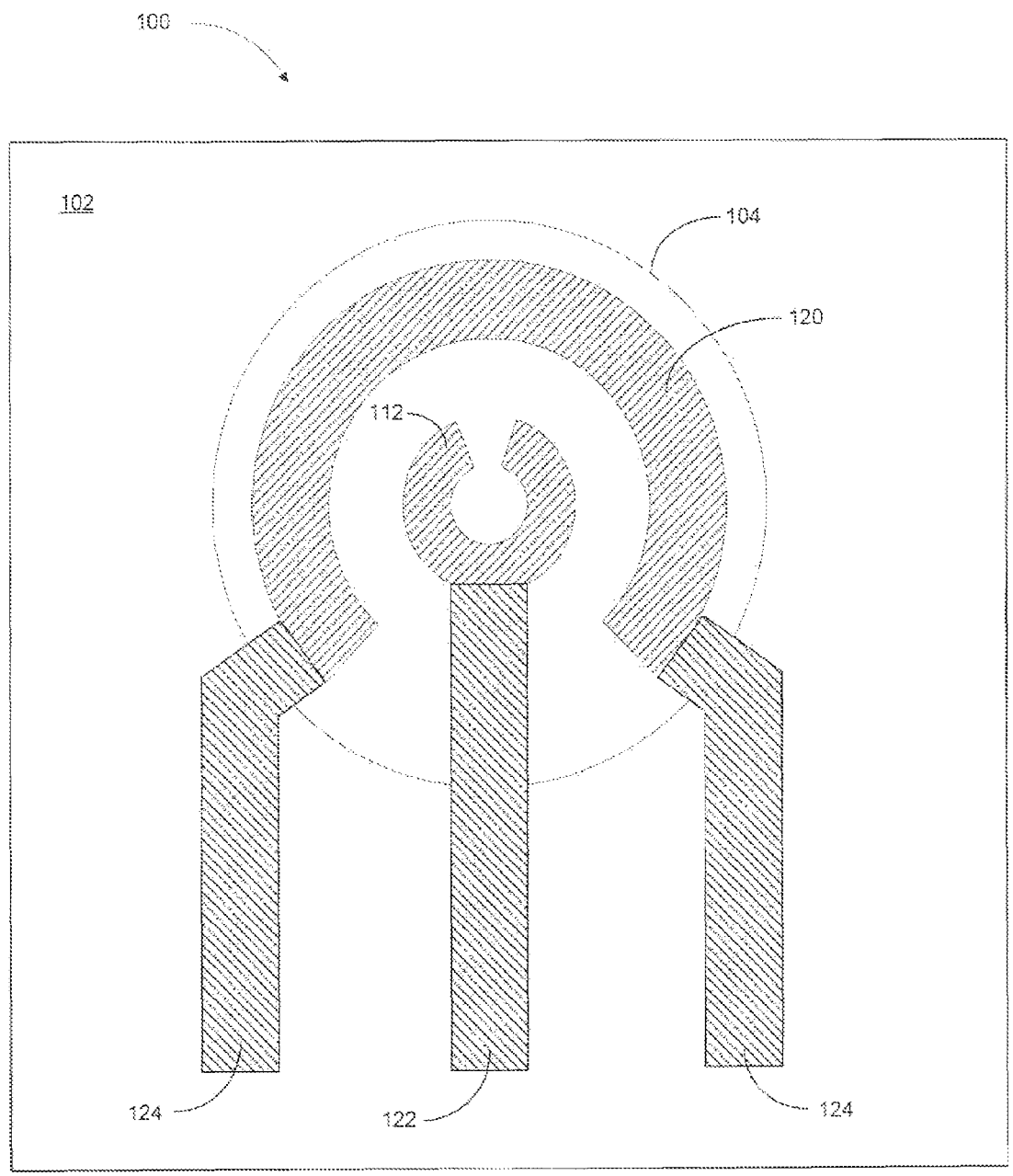
FIG. 7 illustrates a top view of the exemplary VCSEL in accordance with another embodiment of the invention.

FIG. 7 illustrates a top view of the exemplary VCSEL 100 in accordance with an embodiment of the invention. After the outer perimeter region of the lower DBR 104 has been removed to expose the underlying substrate 102, one or more bond pads 124 are formed over the substrate 102, and configured to make electrical contact to the lower DBR 104 via the Ohmic contact 120. Additionally, one or more bond pads 122 are formed over the substrate 102, and configured to make electrical contact to the upper DBR 108 via the Ohmic contact 112. A voltage potential applied across the bond pads 122 and 124 activates the VCSEL to generate the laser beam. The bond pads 122 and 124 may be configured as transmission lines each having a predetermined characteristic impedance, such as 50 Ohms.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

The invention claimed is:

1. A vertical cavity surface emitting laser (VCSEL), comprising:
   a substrate;
   a lower mirror disposed over the substrate;
   an active layer disposed over the lower mirror;
   an upper mirror disposed over the active layer, wherein the upper mirror includes a first groove and a first Ohmic contact to the upper mirror formed within the first groove;
   a passivation layer disposed along a side wall of the active layer, wherein the passivation layer is implanted with ions; and
   wherein a concentration of the ions is substantially maximum approximately at an interface of the passivation layer and the active layer.

2. The VCSEL of claim 1, wherein the Ohmic contact is configured to define a shape of an optical beam produced by the VCSEL.

3. The VCSEL of claim 1, wherein the lower mirror comprises a distributed Bragg reflector (DBR).

4. The VCSEL of claim 3, wherein the DBR is doped with an n-type dopant.

5. The VCSEL of claim 3, wherein the DBR comprises a plurality of stacked layers of GaAs or Aluminum GaAs (AlGaAs) material having alternating indices of refraction, respectively.

6. The VCSEL of claim 1, wherein the upper mirror comprises a distributed Bragg reflector (DBR).

7. The VCSEL of claim 6, wherein the DBR is doped with a p-type dopant.

8. The VCSEL of claim 6, wherein the DBR comprises a plurality of stacked layers of GaAs or Aluminum GaAs (AlGaAs) material having alternating indices of refraction, respectively.

9. The VCSEL of claim 1, wherein the passivation layer comprises silicon nitride ($Si_xN_y$) or silicon dioxide ($SiO_2$).

10. The VCSEL of claim 1, wherein the lower mirror includes a second groove and a second ohmic contact to the lower mirror formed within the second groove.

11. The VCSEL of claim 10, further comprising:
    a first bond pad disposed over the substrate, wherein the first bond pad is electrically connected to the upper mirror via the first ohmic contact; and
    a second bond pad disposed over the substrate, wherein the second bond pad is electrically connected to the lower mirror via the second ohmic contact.

12. The VCSEL of claim 1, wherein the upper mirror is configured to form a mesa, and further wherein the first groove is formed within a top surface of the mesa.

13. A method of manufacturing a vertical cavity surface emitting laser (VCSEL), comprising:
    forming a lower mirror over a substrate;
    forming an active layer over the lower mirror;
    forming an upper mirror over the active layer;
    forming a first groove into the upper mirror;
    forming a first ohmic contact to the upper mirror within the first groove;
    forming an ion implanted layer along a sidewall of the active layer, wherein forming the ion implanted layer comprises:
        removing a portion of the active layer to define the sidewall of the active layer;
        forming a passivation layer along the sidewall of the active layer; and
        implanting ions into the passivation layer to form the ion implanted layer; wherein the maximum concentration of the ions is near the interface of the passivation layer and the active layer.

14. The method of claim 13, further comprising configuring the ohmic contact to define a shape of an optical beam produced by the VCSEL.

15. The method of claim 13, wherein the first groove is formed by a dry etching process.

16. The method of claim 13, wherein implanting ions into the passivation layer comprises directing ions into the passivation layer in a direction that is skewed from a vertical axis of the VCSEL by a predetermined angle.

17. The method of claim 16, wherein the predetermined angle is approximately 20 degrees or greater.

18. The method of claim 13, further comprising:
forming a second groove into the lower mirror; and
forming a second ohmic contact to the lower mirror within the second groove.

19. The method of claim 18, further comprising:
forming a first bond pad over the substrate such that the first bond pad is electrically connected to the upper mirror via the first ohmic contact; and
forming a second bond pad over the substrate such that the second bond pad is electrically connected to the lower mirror via the second ohmic contact.

20. The method of claim 13, wherein forming the upper mirror comprises removing a portion of the upper mirror to form a mesa; and wherein forming the first groove comprises forming the first groove within a top surface of the mesa.

21. A vertical cavity surface emitting laser (VCSEL), comprising:
a substrate;
a lower mirror disposed over the substrate;
an active layer disposed over the lower mirror;
an upper mirror disposed over the active layer; and
an ion implanted layer disposed along a sidewall of the active layer and at least a substantial portion of a sidewall of the upper mirror, wherein a concentration of ions within the ion implanted layer is substantially maximum approximately at an interface of the ion implanted layer and the active layer.

22. The VCSEL of claim 21, wherein the ion implanted layer is also disposed over a sidewall of the upper mirror.

23. The VCSEL of claim 21, wherein the ion implanted layer is also disposed over an upper portion of the lower mirror.

24. The VCSEL of claim 21, further comprising:
a first groove formed into the upper mirror; and
a first ohmic contact to the upper mirror formed within the first groove.

25. The VCSEL of claim 24, further comprising:
a second groove formed into the lower mirror; and
a second ohmic contact to the lower mirror formed within the second groove.

26. The VCSEL of claim 25, further comprising:
a first bond pad disposed over the substrate, wherein the first bond pad is electrically connected to the upper mirror via the first ohmic contact; and
a second bond pad disposed over the substrate, wherein the second bond pad is electrically connected to the lower mirror via the second ohmic contact.

27. A method of manufacturing a vertical cavity surface emitting laser (VCSEL), comprising:
forming a lower mirror over a substrate;
forming an active layer over the lower mirror;
forming an upper mirror over the active layer;
forming a passivation layer along a side wall of the active layer and along at least a substantial portion of a side wall of the upper mirror;
implanting ions into the passivation layer along the side wall of the active layer and along the at least substantial portion of the sidewall of the upper mirror;
wherein implanting ions into the passivation layer comprises implanting ions into the passivation layer with an energy that results in an ion concentration that is substantially maximum at an interface of the passivation layer and the active layer.

28. The method of claim 27, wherein the direction of ion implantation is skewed from a vertical axis of the VCSEL by a predetermined angle.

29. The method of claim 28, wherein the predetermined angle is approximately 20 degrees or greater.

30. The method of claim 27, wherein implanting ions into the passivation layer is performed by a steep angle ion implantation process.

31. The method of claim 27, further comprising:
forming a first groove into the upper mirror; and
forming a first ohmic contact to the upper mirror within the first groove.

32. The method of claim 31, further comprising:
forming a second groove into the lower mirror; and
forming a second ohmic contact to the lower mirror within the second groove.

33. The method of claim 32, further comprising:
forming a first bond pad over the substrate such that the first bond pad is electrically connected to the upper mirror via the first ohmic contact; and
forming a second bond pad over the substrate such that the second bond pad is electrically connected to the lower mirror via the second ohmic contact.

34. A vertical cavity surface emitting laser (VCSEL), comprising:
a substrate;
a lower mirror disposed over the substrate;
an active layer disposed over the lower mirror;
an upper mirror disposed over the active layer; and
an ion implanted layer disposed along a sidewall of the active layer, wherein a concentration of ions within the ion implanted layer is substantially maximum approximately at an interface of the ion implanted layer and the active layer.

35. A method of manufacturing a vertical cavity surface emitting laser (VCSEL), comprising:
forming a lower mirror over a substrate;
forming an active layer over the lower mirror;
forming an upper mirror over the active layer;
forming a passivation layer along a side wall of the active layer; and
implanting ions into the passivation layer, wherein implanting ions into the passivation layer comprises implanting ions into the passivation layer with an energy that results in an ion concentration that is substantially maximum at an interface of the passivation layer and the active layer.

* * * * *